(12) United States Patent
Loeppert et al.

(10) Patent No.: US 9,516,421 B1
(45) Date of Patent: Dec. 6, 2016

(54) ACOUSTIC SENSING APPARATUS AND METHOD OF MANUFACTURING THE SAME

(71) Applicant: Knowles Electronics, LLC, Itasca, IL (US)

(72) Inventors: Peter Loeppert, Durand, IL (US); Michael Pedersen, Ashton, MD (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/974,499

(22) Filed: Dec. 18, 2015

(51) Int. Cl.
*H04R 9/08* (2006.01)
*H04R 7/20* (2006.01)

(52) U.S. Cl.
CPC ...................................... *H04R 7/20* (2013.01)

(58) Field of Classification Search
CPC ............... H04R 7/16; H04R 7/18; H04R 7/20; H04R 17/00
See application file for complete search history.

(56) References Cited

U.S. PATENT DOCUMENTS

| | | | |
|---|---|---|---|
| 5,452,268 A | | 9/1995 | Bernstein |
| 5,633,552 A | * | 5/1997 | Lee .................. A61B 17/32006 310/311 |
| 6,535,460 B2 | | 3/2003 | Loeppert |
| 7,190,038 B2 | | 3/2007 | Dehe et al. |
| 7,473,572 B2 | | 1/2009 | Dehe et al. |
| 7,781,249 B2 | | 8/2010 | Laming et al. |
| 7,795,695 B2 | | 9/2010 | Weigold et al. |
| 7,825,484 B2 | | 11/2010 | Martin et al. |
| 7,829,961 B2 | | 11/2010 | Hsiao |
| 7,856,804 B2 | | 12/2010 | Laming et al. |
| 7,903,831 B2 | | 3/2011 | Song |
| 8,531,088 B2 | | 9/2013 | Grosh et al. |
| 9,055,372 B2 | | 6/2015 | Grosh |
| 2005/0207605 A1 | | 9/2005 | Dehe et al. |
| 2007/0278501 A1 | | 12/2007 | MacPherson et al. |
| 2008/0175425 A1 | | 7/2008 | Roberts et al. |
| 2008/0267431 A1 | | 10/2008 | Leidl et al. |
| 2008/0279407 A1 | | 11/2008 | Pahl |
| 2008/0283942 A1 | | 11/2008 | Huang et al. |
| 2009/0001553 A1 | | 1/2009 | Pahl et al. |
| 2009/0180655 A1 | | 7/2009 | Tien et al. |

(Continued)

OTHER PUBLICATIONS

S.S. Lee, R.P. Ried & R.M. White, Piezoelectric Cantilever Microphone and Microspeaker, J. MEMS, vol. 5(4), Dec. 1996, pp. 238-242.

*Primary Examiner* — Tuan D Nguyen
(74) *Attorney, Agent, or Firm* — Foley & Lardner LLP

(57) ABSTRACT

An acoustic sensing apparatus includes a diaphragm; a support structure surrounding the diaphragm and a gap disposed there between, the diaphragm and support structure separating a front volume and a back volume; one or more cantilevers disposed in the gap and between the diaphragm and the support structure, a first end of each of the cantilevers coupled to the support structure and being non-moving, and a second end of each of the cantilevers being free to move; a sealing material covering at least the gap between the diaphragm and the support structure, the sealing material creating an acoustic seal between the front volume and the back volume; and a sensor that converts a diaphragm movement into an electrical signal. The second end of each of the cantilevers is coupled to the sealing material.

20 Claims, 22 Drawing Sheets

(56) References Cited

U.S. PATENT DOCUMENTS

| | | |
|---|---|---|
| 2009/0309173 A1* | 12/2009 | Nakatani ................. B81B 3/007 |
| | | 257/415 |
| 2010/0046780 A1 | 2/2010 | Song |
| 2010/0052082 A1 | 3/2010 | Lee et al. |
| 2010/0084721 A1* | 4/2010 | Wu ....................... B81B 3/0072 |
| | | 257/415 |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2012/0250909 A1 | 10/2012 | Grosh et al. |
| 2013/0223023 A1* | 8/2013 | Dehe ..................... B81B 7/0029 |
| | | 361/752 |
| 2015/0362394 A1* | 12/2015 | Shimoyama .......... G01L 9/0001 |
| | | 73/702 |

* cited by examiner

US 9,516,421 B1

ACOUSTIC SENSING APPARATUS AND METHOD OF MANUFACTURING THE SAME

TECHNICAL FIELD

This application relates to microphones.

BACKGROUND OF THE INVENTION

Different types of acoustic devices have been used through the years. One type of acoustic sensing device is a microphone. A microphone has a sensor that transforms acoustic energy into electrical signals. Microphones are deployed in various types of devices such as personal computers or cellular phones.

Capacitive microelectromechanical system (MEMS) microphones have recently become popular in consumer electronics. However, there are a number of different transduction mechanisms that can be used in microphones beyond capacitive, including piezoresistive, piezoelectric, and optical among others. What these approaches all have in common is the use of a diaphragm which displaces in response to an acoustic pressure. The transduction method then turns the displacement into an electrical signal corresponding to the acoustic pressure. One goal is to optimize sensitivity in a very small microphone which is done by maximizing the displacement of the diaphragm under acoustic pressure. This can be accomplished by using a simply supported diaphragm which is one that is free to rotate or displace at its edge. In order to rotate or displace at the edge, a simply supported diaphragm must have a gap around the majority of its perimeter. This gap however leads to acoustic leakage which in conjunction with the back volume defines the low frequency response of the microphone.

In order to create a small microphone with a simply supported diaphragm, one must control the total area of the gap at the edge of the diaphragm. The gap width may be made very small, for instance it is common to make gaps of 1 micron width. However the variation of the gap width directly affects the acoustic leak resistance and thus figures directly in the variability of the low frequency roll-off, an undesirable outcome. If the thin film(s) used to form the diaphragm have a residual stress gradient, which is very common, the diaphragm will be bowed out of plane and the gap will increase correspondingly, contributing to the response variability.

As an example, U.S. Pat. No. 6,535,460 by Loeppert describes a capacitive microphone that has a simply supported diaphragm which is free around it periphery. The gap formed around the perimeter largely determines the low frequency performance.

As a second example, U.S. Pat. No. 5,452,268 by Bernstein discloses a capacitive microphone that has a simply supported diaphragm with springs arranged around the perimeter to establish and maintain the diaphragm compliance. The gap around the majority of the perimeter largely determines the low frequency response. Residual stress gradients in the diaphragms of Loeppert '460 or Bernstein '268 add to the gap variability.

As a third example, U.S. Pat. No. 9,055,372 by Grosh describes a piezoelectric microphone that uses cantilever diaphragms, which require a gap around the majority of the perimeter. Residual stress gradient in the piezoelectric films results in the bowing of the diaphragm and larger than designed gaps along the edge.

Various types of sensors also exist that are used in microphones. In a capacitive microelectromechanical system (MEMS) sensor or device, a silicon substrate supports a diaphragm and a back plate. The MEMS sensor is disposed on a base and enclosed by a housing (e.g., a cup or cover with walls). The microphone itself includes a port that may extend through the base (for a bottom port device) or through the top of the housing (for a top port device). In any case, sound energy traverses through the port, moves the diaphragm and creates a changing potential of the back plate, which creates an electrical signal.

MEMS devices have various limitations and so piezoelectric sensing devices have been used in some circumstances. In these devices, the sound energy causes the piezoelectric materials in these devices to bend, which in turn produces an electrical charge and hence an electrical signal.

However, various problems also exist in these devices. For example, when these devices are deployed as sensors, residual stress gradients in the piezoelectric material causes it to bend, and a large gap is typically created between the back volume and front volume in the sensing device. This large gap (relative to the size of the entire device) negatively impacts device performance. Although the overall device can be made larger to mitigate the gap that is created, this dimensioning inherently makes the size of the device much larger, thereby making the device impractical to use in situations where small devices are needed or required (e.g., in small devices where space is at a premium such as cellular phones and tablets).

The problems of previous approaches have resulted in some user dissatisfaction with these previous approaches.

BRIEF DESCRIPTION OF THE DRAWINGS

For a more complete understanding of the disclosure, reference should be made to the following detailed description and accompanying drawings wherein.

Figure 1:
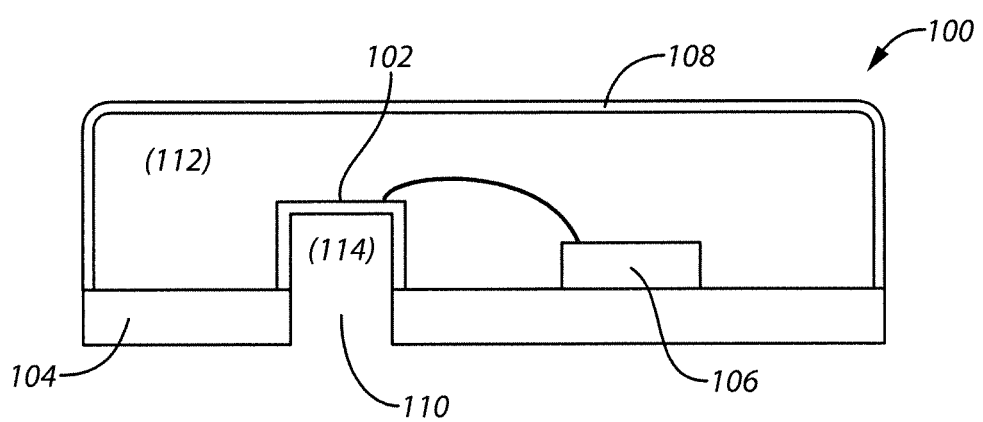
FIG. 1 comprises a diagram of a side cutaway view of a microphone including a sensing device according to various embodiments of the present invention.
Figure 2:
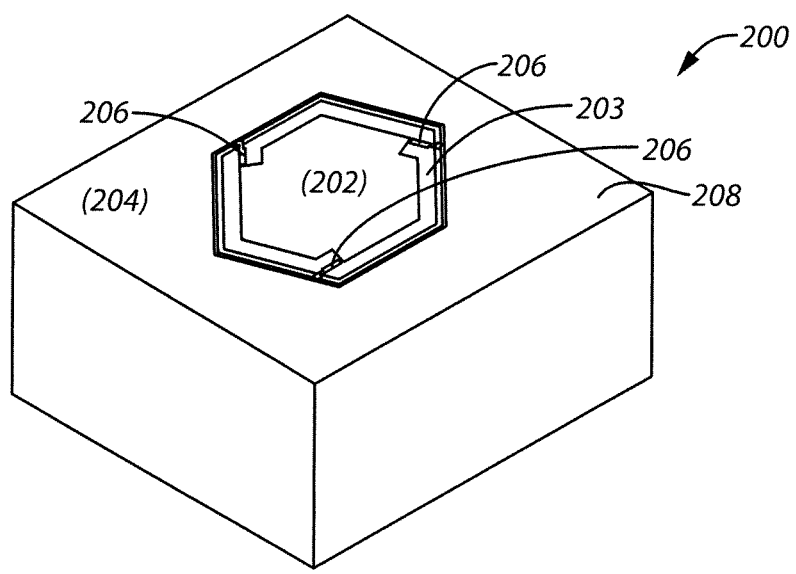
FIG. 2 comprises a perspective diagram of a sensing apparatus according to various embodiments of the present invention.
Figure 4:
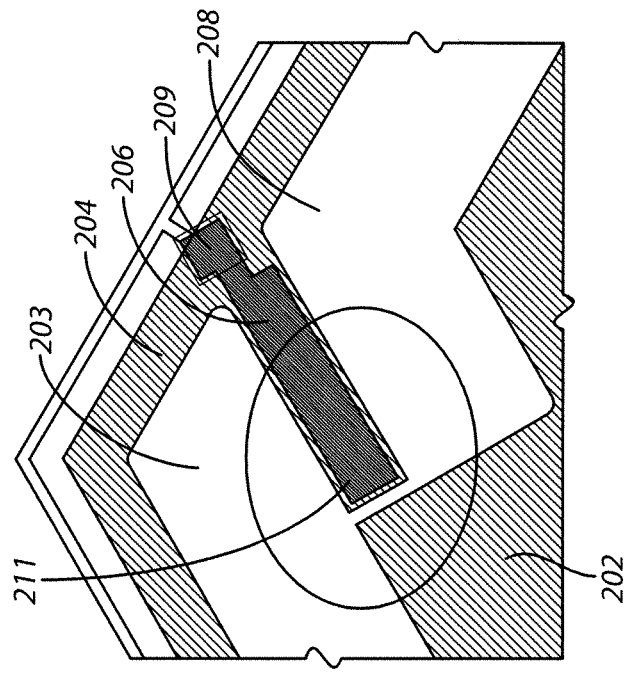
FIG. 4 comprises a close-up diagram of a portion of the top view of FIG. 3 showing a lack of direct connection between the sensing element to the diaphragm according to various embodiments of the present invention.
Figure 3:
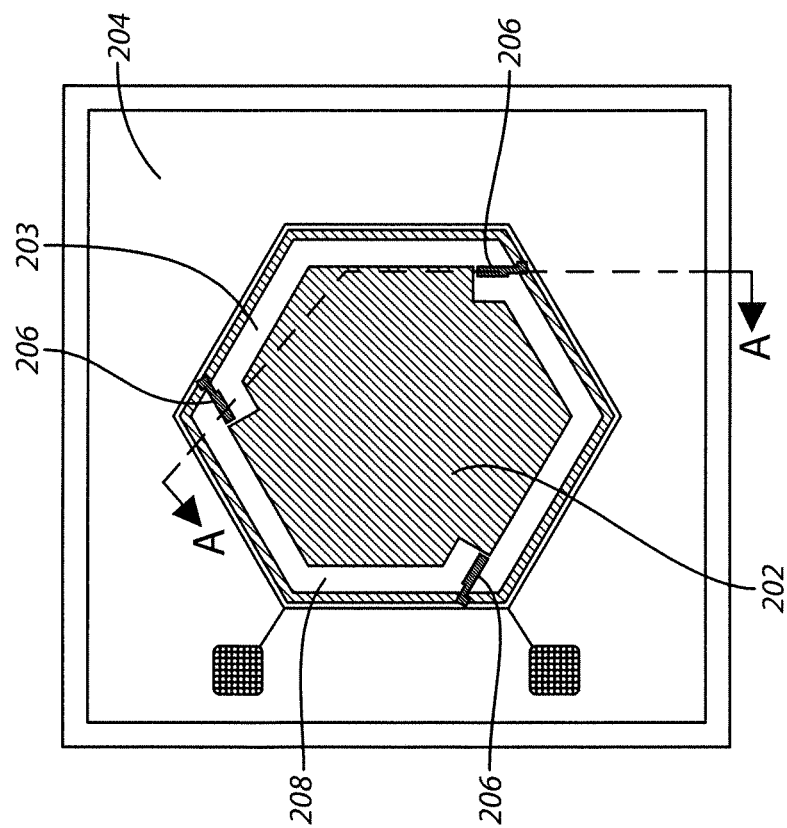
FIG. 3 comprises a top view of the sensing device of FIG. 2 according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

It is an objective of the approaches described herein to provide an acoustic seal for the gap between a diaphragm and support structure in a microphone. The acoustic seal is flexible enough to not significantly limit the displacement of the diaphragm and yet eliminate the acoustic leak past the diaphragm. A controlled leak can then be formed either through the seal material, the diaphragm, or the support structure by means of photolithography and etching to set a precise low frequency response. The term acoustic seal as used herein means to block air flow over the intended acoustic frequency range. The vent allows air flow at frequencies below the intended acoustic frequency range. For example, it is common for the vent to be effective below 30 Hz.

The present approaches provide sensing devices that are small, exhibit excellent performance (e.g., high sensitivity) characteristics, produce low noise, and provide a controlled low frequency roll off. In some aspects, a piezoelectric apparatus is provided with cantilever piezoelectric elements where the cantilever piezoelectric elements in some examples experience substantially a single direction of curvature under acoustic pressure, and where the front volume and rear volumes are acoustically sealed from each other. More specifically and advantageously, the present approaches provide maximum motion over the sensing region, and sealing between back volumes and front volumes.

In the approaches described herein, separate and discrete cantilevers (sensing elements) are provided which are relativity soft and flexible as compared to a central diaphragm/paddle, which is relatively stiff. So configured, optimal acoustic performance is provided with a small back volume.

A connection or linking arrangement connects the cantilevers to the diaphragm and this connection element optimizes the signal transduction. This may be a direct connection or a separate hinge-like element may be used. In any case, the linking arrangement between the paddle and cantilevers is used to transfer the integrated mechanical force of the moving diaphragm to the cantilevers.

Several examples of connection arrangements are possible. For example, the cantilever may be connected directly to the diaphragm and the cantilever assumes an S-shaped curve under sound pressure. The S-shaped curve may be asymmetric or symmetric. If symmetric, half the cantilever bends upward and half of it bends downward.

In another example, the connection element may be a soft hinge. More specifically, a reduced connection is formed between the cantilever and the diaphragm such as by using radial or tangential filaments. This type of connection is softer to bend than a cantilever-diaphragm connection, since the cross sectional area of the filament is less than the cross sectional area of the entire cantilever. This approach still results in an "S" shaped curve for the cantilever as it bends under sound pressure, but the shape of the curve so-formed is now asymmetrical with a tighter bend over the softer region at the connection.

In yet another example, a very soft connection may be used as the connection element or mechanism. For example, only sealing material is used to connect the cantilever to the diaphragm. This approach still results in the cantilever assuming an "S" shape under sound pressure, but since the sealing material is so soft, it acts like a hinge. Since the hinge cannot be ideal and offer no resistance to bending, it looks substantially like a "C". More strain may be obtained in this approach (compared to the others) because most of the cantilever has a single direction curvature.

If a piezoelectric cantilever assumes an S-shaped curve under sound pressure, the sign of charges produced in one region of the bent cantilever cancel charges produced in another area of the bent cantilever. Advantageously, the present approaches in some aspects provide a hinge-like element that forces or provides a single curvature of the sensing element so that a substantially C-shaped curve is obtained, not an S-shaped curve. Consequently, charges whose signs that may cancel each other out are not obtained. In other words, a pure "S" shape curve is not obtained, and the charges do not completely cancel out each other.

Piezoresistive sensors behave similarly in that the sign of the signal is dependent on the direction of the cantilever curvature. Individual sensors should be limited to regions of the cantilever with a single direction of curvature.

In some aspects, an acoustic apparatus includes a free or simply supported plate (paddle) upon which an ambient acoustic pressure acts. The paddle acts as an integrator of acoustic pressure to a mechanical force. One or more cantilevers are constructed of piezoelectric and electrically conducting materials and form a layered stack in which an out-of-plane deflection causes a strain in the piezoelectric material, leading to build-up of an electric charge on the conducting layers in the stack. The cantilever furthermore is clamped to a supporting substrate at one end.

As mentioned, a flexible layer (seal) between the paddle, cantilevers and the supporting substrate is also provided. The purpose of the seal is to provide a controlled acoustic seal across the paddle and cantilevers, with the ability to control tightly the acoustic bypass between front and back volumes in the acoustic sensor. A vent may be provided in the seal, the diaphragm, or support structure. The flexible layer is sufficiently compliant to minimally impact the overall compliance of the sensor structure.

A directional microphone has two front volumes and no back volume. The sealing material provides an acoustic seal between the two front volumes and there is no need for a vent. The examples herein are all described as if they were used in omni-directional microphones with a front and a back volume. These examples are not intended to limit the scope of the invention.

In examples, the material of the seal is a low modulus material (i.e., it is soft), takes a large level of strain (i.e., is stretchable), but is also elastic (i.e., can stretch over and over again without permanently deforming). PDMS is an example of one such material. PDMS can be spin coated onto a wafer surface with a layer thickness, for example, of approximately 1 micron. The devices provided by the present approaches achieve a sufficient acoustic seal in order to build a complete assembled microphone with a small back volume and satisfactory low frequency roll-off.

The linking mechanism realizes a deflection for the cantilevers that has substantially a single direction of curvature. This substantially single direction curvature ensures the largest possible signal (electrical charge) is produced and obtained from the piezoelectric material since the bending strain through the length of the cantilever has the same sign. In one aspect and to achieve this goal, the tip of the cantilever is free to rotate and is not clamped to the paddle. In addition, a single end fixed beam is less stiff than a doubly supported beam so even in the case of capacitive or optical displacement detection, a soft hinge attachment to the diaphragm is advantageous.

In other examples, the flexible layer (seal) is deployed in capacitive microphones, piezoresistive microphones, and optical microphones to acoustically seal the front volumes and back volumes of these devices. In aspects, the seal material can be polydimethylsiloxane (PDMS) or other elastomeric materials that can be deposited in thin layers. Other examples of materials are possible.

Referring now to FIG. 1, a microphone 100 with a sensing element is described. The sensing element 102 may be configured as described elsewhere herein. The sensing element 102 is disposed on a base 104 together with an integrated circuit 106. Sensing element 102 and integrated circuit 106 could be formed on a common semiconductor die. A cover 108 encloses the sensing element 102 and the integrated circuit 106. A port 110 extends through the base 104. The sensing element 102 separates a back volume 112 from a front volume 114. The back volume 112 is acoustically sealed from the front volume 114. A vent may extend through the sensing element to allow pressure equalization (atmospheric pressure changes) between the front volume 114 and the back volume 112. This vent may be placed where convenient in the seal material, the diaphragm, or the support structure as long as it provides communication between the front and back volumes.

In one aspect, the sensing element 102 includes cantilever piezoelectric elements and these cantilever piezoelectric elements experience a single direction of curvature under application of sound pressure. As mentioned, the front volume 114 and rear volume 112 are acoustically sealed from each other over the acoustic frequency range. In some examples, a hinge-like element is provided that allows the cantilever elements to assume substantially a C-shape, and not a symmetrical S-shaped curve when sound pressure is applied.

In one example of the operation of the system of FIG. 1, sound pressure actuates the sensing element 102, which converts the sound energy into an electrical signal, which is processed at the integrated circuit 106. The processed signal can be output from the microphone 100. Further details of sensing elements that can be used in the microphone 100 are described elsewhere herein.

Figure 5:
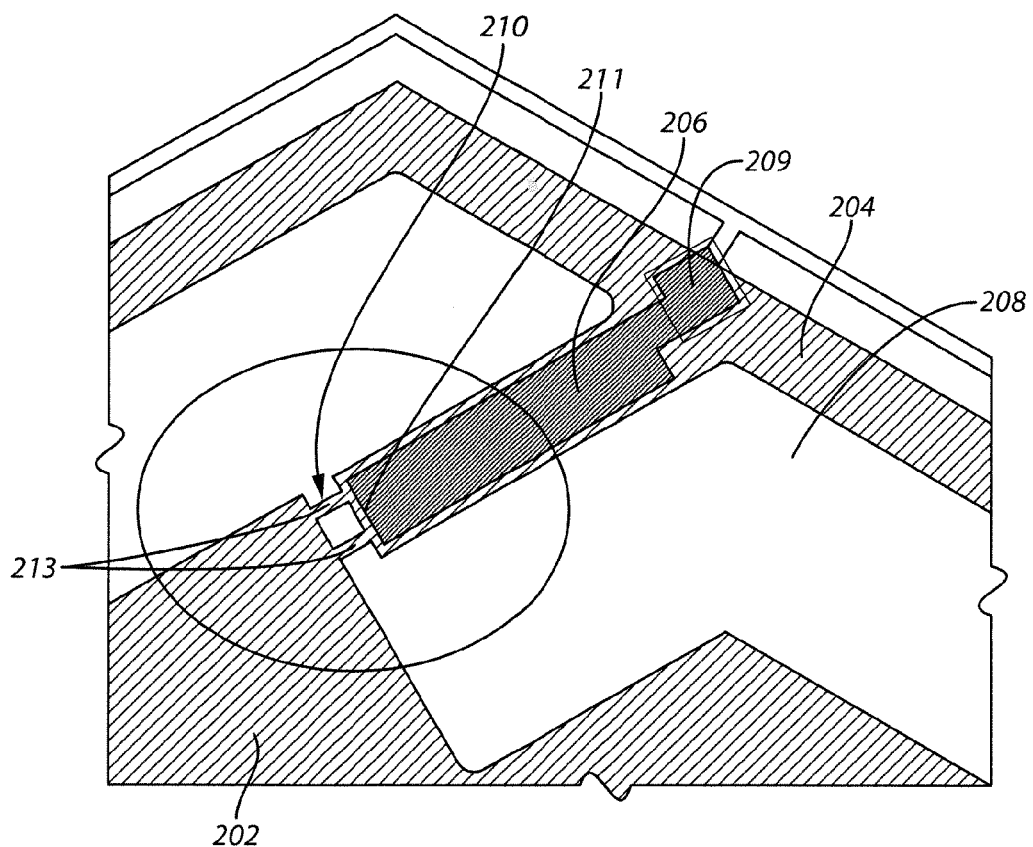
FIG. 5 comprises a close-up diagram of a portion of the top view of FIG. 3 with inclusion of one example of a connection element to connect the sensing element to the diaphragm according to various embodiments of the present invention.
Figure 6:
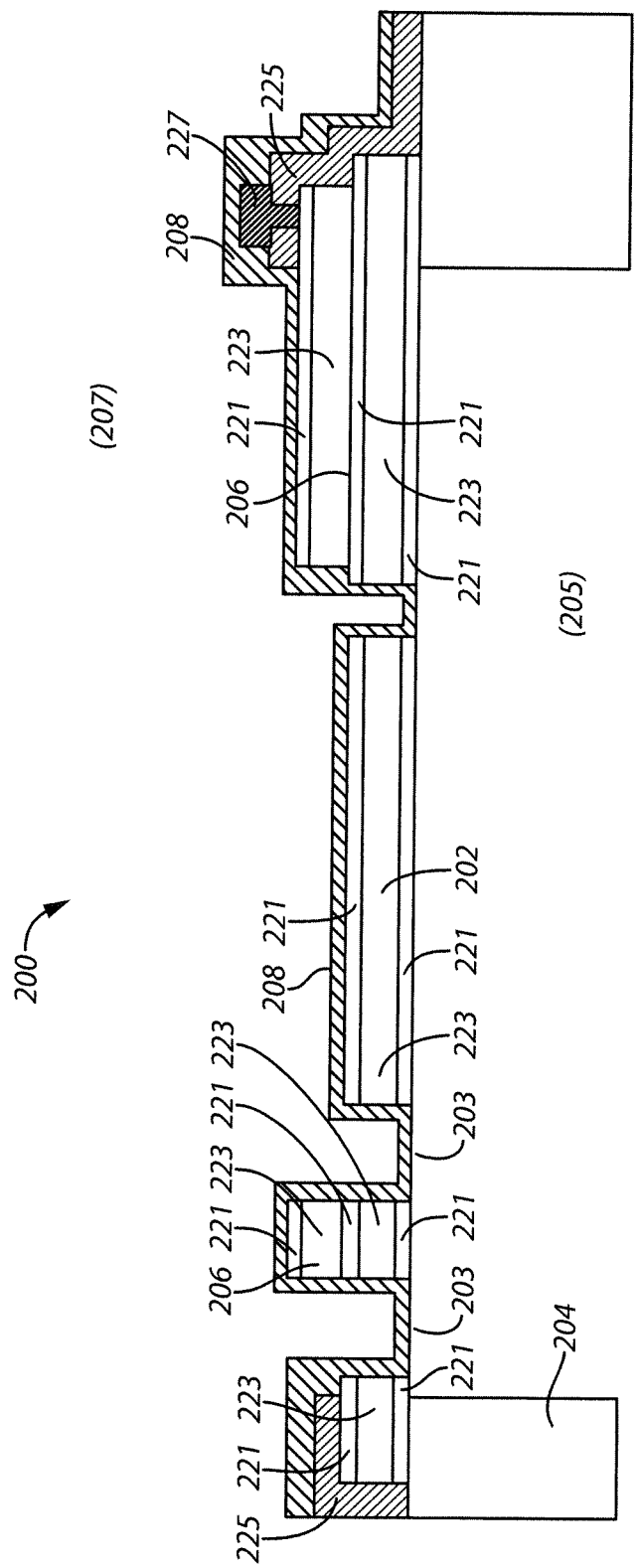
FIG. 6 comprises a cross-sectional diagram taken along line A-A of FIG. 3 showing another example of a connection element according to various embodiments of the present invention.

Referring now to FIGS. 5 (showing a soft linkage element), and 2,3,4,6 (showing a very soft linkage element) in which one example of a sensing apparatus or device 200 is described. The sensing apparatus 200 includes a diaphragm 202, a support structure 204, sensing elements (cantilevers) 206, a sealing material 208, and a linking mechanism 210. The sealing material 208 is spread across the entire top surface of the sensing apparatus 200, and selectively removed so that it covers at least the gap between the diaphragm 202 and the support structure 204. This sealing material may be the sole linking mechanism 210 as shown in FIG. 6 or a soft linking mechanism may be used as shown in FIG. 5.

The diaphragm 202 is mechanically rigid with respect to the seal material 208. In one example, the diaphragm 202 is constructed of a sandwich of aluminum nitride piezoelectric material and metal conductors such as molybdenum. Other examples of materials and configurations are possible. In some examples, the diaphragm 202 has a vent extending through it. The purpose of the vent is to equalize atmospheric pressure between the front and back volumes.

The support structure 204 surrounds the diaphragm 202. In one example, the support structure 204 is constructed of silicon. Other examples of materials are possible. A gap 203 is disposed and formed between the diaphragm 202 and the support structure 204. The diaphragm 202 and support structure 204 also separate a front volume 205 and a back volume 207. It will be appreciated that the placement of front volume 205 and back volume 207 assumes a bottom port device, but in a top port device these volumes would be the reversed.

In this example, the sensing elements 206 include one or more individual sensing elements disposed at separate locations (at approximately equal distance locations about the circumference of the diaphragm 202). In this example (and many of the other examples described herein), three sensing elements may be used, but it will be appreciated that any number are possible. The sensing elements 206 are disposed in the gap 203 and between the diaphragm 202 and the support structure 204. A first end 209 of each of the sensing elements 206 is coupled to the support structure 204, and a second end 211 of each of the sensing elements 204 is free to move or rotate. It will be appreciated that more than three sensing elements can be used, and that in some cases one or two might also be used.

As mentioned, several approaches may be used for the linking mechanism 210. As shown in FIG. 5, a reduced connection 213 is formed between the cantilever and the diaphragm 202 such as with radial filaments. The filaments may be separate or integrally formed with the diaphragm and/or cantilever. The filaments 213 are softer to bend than an entire cantilever since the cross sectional area of the filaments is less than the cross sectional area of the entire cantilever (when a direct connection is used). This still results in an "S" shaped curve for the cantilever 206 as it bends under sound pressure, but the shape of the curve so-formed is now asymmetrical with a tighter bend over the softer region at the connection.

Referring now to FIG. 6, a very soft connection may be used instead of the soft connection as the connection element or mechanism. More specifically, only sealing material 208 is used to connect the cantilever 206 to the diaphragm 202. This approach still results in the cantilever 206 assuming an "S" shape under sound pressure, but since the sealing material is so soft it acts like a hinge. Since the hinge cannot be ideal and offer no resistance to bending, it appears substantially like a "C".

Still referring to FIG. 6, the sensing apparatus 200 is shown in the cross-section and is constructed of a plurality of metal layers 221 and a plurality of piezoelectric layers 223. Insulation layers 225 are deposited around metal contacts 227. The sealing material 208 covers various portions including the gap 203 between the diaphragm 202 and the end of the sensing element 208. The whole structure is disposed on the support structure 204, which is constructed of silicon in one example.

The sealing material 208 covers at least the gap 203 between the diaphragm 202 and the support structure 204. The sealing material 208 creates an acoustic seal between the front volume 205 and the back volume 207. By acoustic seal and as used herein, it is meant to close the gap in order to isolate the front and back volumes over the acoustic frequencies of interest. In one example, the sealing material 208 is polydimethylsiloxane (PDMS). Other examples of sealing material are possible.

Still referring to FIG. 6, the linking mechanism 210 in one aspect is formed by the sealing material 208 and is disposed in the gap 203. The linking mechanism 210 connects the second end 211 of each of the sensing elements 206 to the diaphragm 202, such that applied sound pressure to the diaphragm 202 moves the second end 211 of the sensing elements 206. The second end 211 of each of the sensing elements 206 is free to rotate and move. In some examples, the linking mechanism 210 acts as a hinge.

In the examples of FIG. 5 and FIG. 6, a first portion of each sensing element 206 is adjacent to the diaphragm 202 and has first amount of bend, and a second portion of the sensing element 206 adjacent to the support structure 204 has a second amount of bend. The first amount of bend is more than the second amount of bend.

As explained in greater detail herein and as the sensing element 206 bends, electric charge is created in the sensing element 206. The bending produces a mechanical strain in the layers of the sensing element 206 thereby producing electrical charge. This charge can be detected, produces an electrical signal, and this signal is representative of the received acoustic energy.

In another example, a minimal linking mechanism 210 is employed. In other words, the sealing material 208 provides the only connection between sensing elements 206 and the diaphragm 202.

Figure 7:
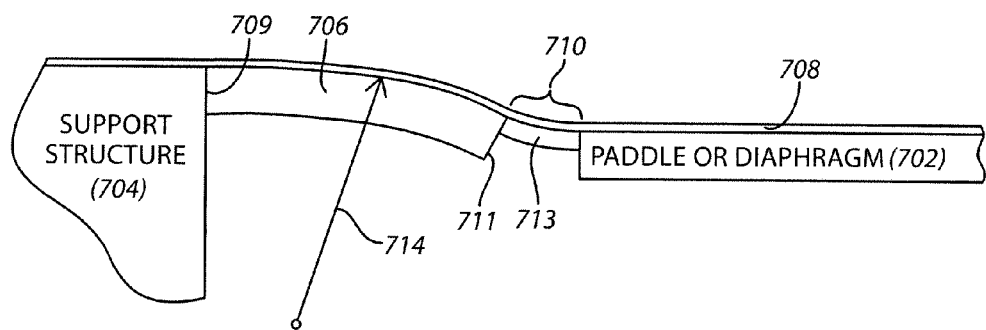
FIG. 7 comprises a diagram of showing the bending of a sensing element according to various embodiments of the present invention.

Referring now to FIG. 7, the bending of the sensing element (e.g., sensing elements 206 of FIGS. 2-6) is described in greater detail. As shown in FIG. 7, a support structure 704 is connected to a sensing element 706. As described herein, a film stack is deposited, typically by sputtering, over an entire surface and then etched to define where the active sensing element 706 resides. The back side is etched to form the back cavity, and hence the support structure 704. The sensing element 706 may be constructed of a plurality of metal layers and piezoelectric layers (e.g., 3 metal layers and 2 piezoelectric layers may be used in one example). The sensing element 706 has a first end 709 adjacent to the support structure that does not rotate, but a second end 711 that is free to rotate in a small gap 710. The small gap 710 is disposed between the sensing element 706 and a paddle or diaphragm 702.

A linking mechanism 713 is disposed in the small gap 710. In one example, the linking mechanism is sealing material 708 that has been deposited into the gap 710. PDMS is typically spin coated to conformally coat the surface of the device.

The sensing element 706 bends along a curve. The curve is substantially C-shaped and not S-shaped and has a radius of curvature 714, which is not constant but changes over the length of the curve.

As the sensing element 706 bends, electric charge is created in the sensing element 706. In these regards, the bending produces a mechanical strain in the layers of the sensing element 706 producing electrical charge. This charge can be detected, produces an electrical signal, and this signal is representative of the received acoustic energy.

If the bending were purely s-shaped (both ends of the "S" being symmetric in shape, the charge produced in each separate bend in the "S" of the S-shaped curve would tend to cancel charge produced in the other part of the "S" shaped curve (since the charge would be of opposite signs) making it difficult to detect acoustic energy. However, some of the present approaches are configured so that a substantially C-shape is used and, consequently, the charge is of one sign, and the charges produced do not cancel each other out. It is preferred to have a single direction curvature (as with the c-curvature) for the sensing element 706 so that only a single set of electrodes are required to capture the signal. Another example of this approach is shown in FIGS. 8, 9, and 10.

Figure 9:
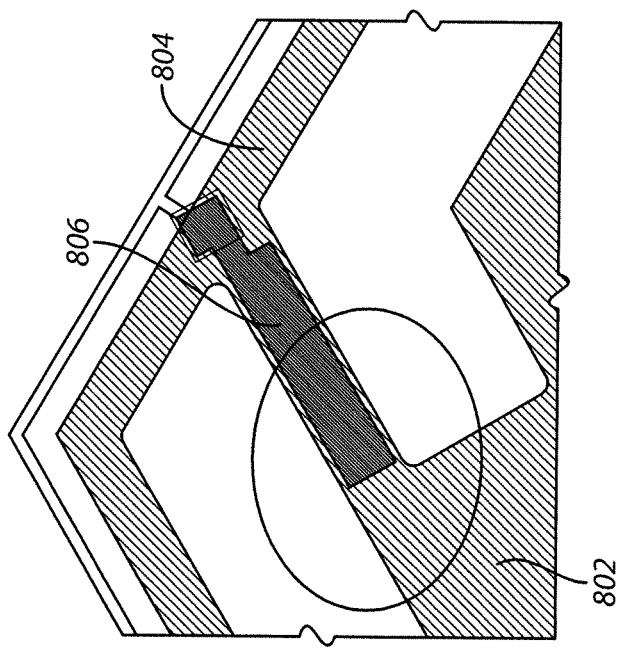
FIG. 9 comprises a close-up of the top view of the sensing device of FIG. 8 according to various embodiments of the present invention.
Figure 8:
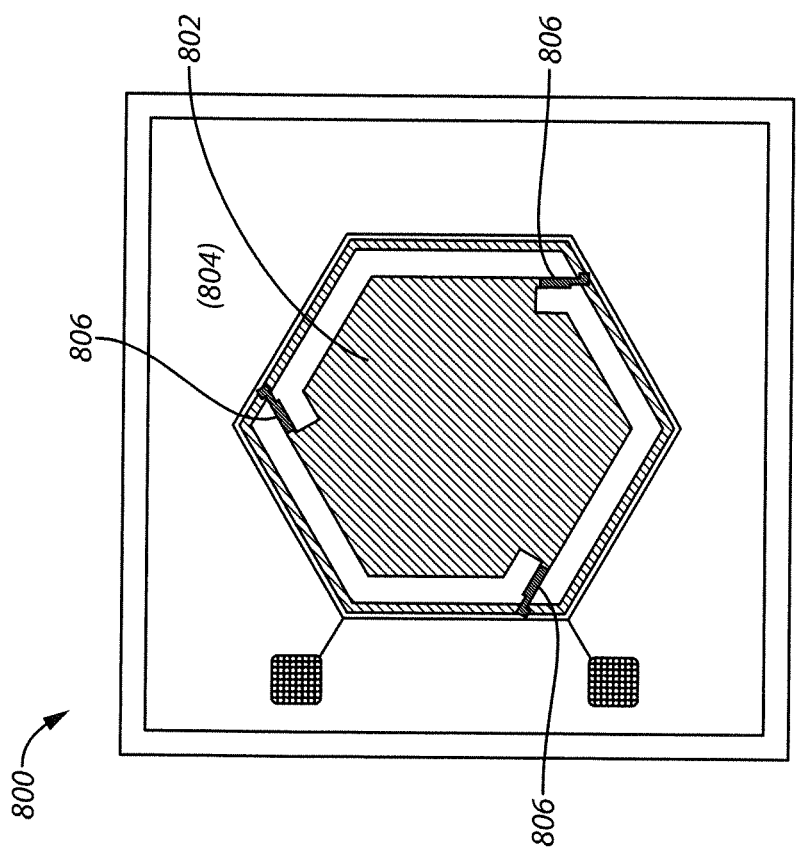
FIG. 8 comprises a top view of a sensing device according to various embodiments of the present invention.
Figure 10:
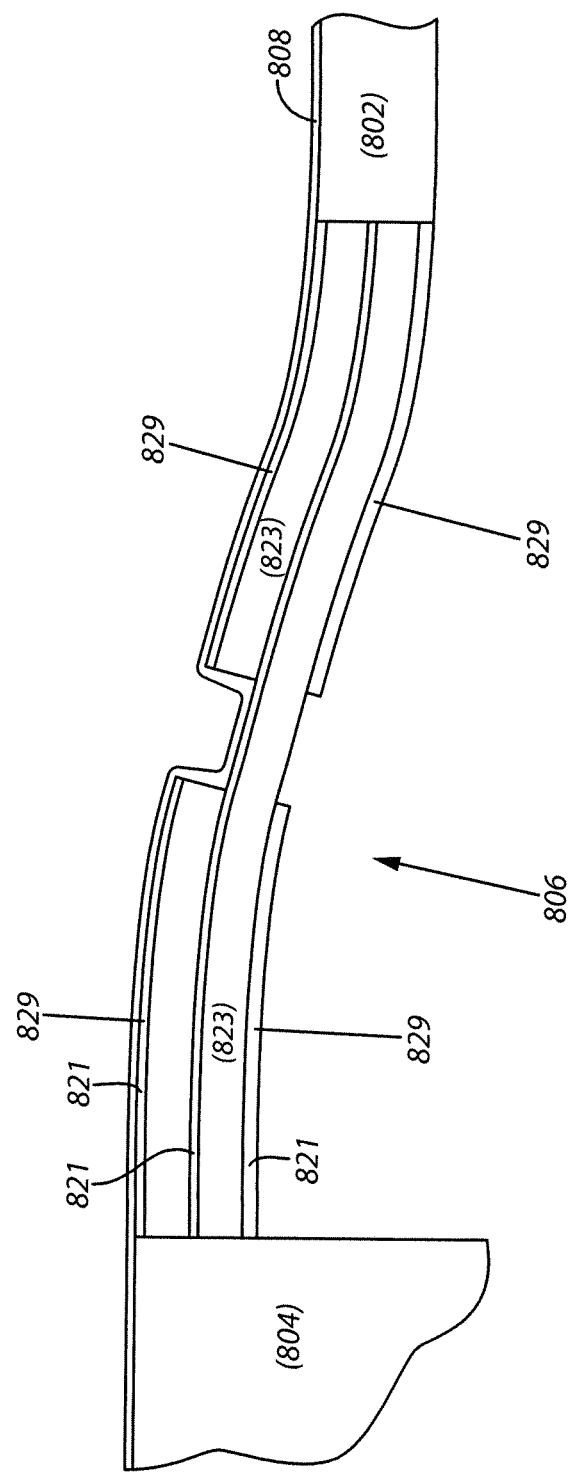
FIG. 10 comprises a side cross sectional view of the examples of FIG. 8 and FIG. 9 according to various embodiments of the present invention.

Referring now to FIG. 8, FIG. 9, and FIG. 10 another example of a sensing apparatus 800 and its connections is described. The sensing apparatus 800 includes a diaphragm 802, a support structure 804, sensing elements 806, and a sealing material 808. These elements are similar to similarly numbered elements described above with respect to FIGS. 2-6, and that description will not be repeated here.

One difference in the examples FIG. 8, FIG. 9 and FIG. 10 is that both ends of the connecting elements are not free to rotate (as compared to one end being free to rotate in the examples of FIGS. 2-6). The sensing elements bend in substantially a symmetric S-shape. FIG. 10 shows metal layers 821 and piezoelectric layers 823 and four electrodes 829 that obtain four signals. The metal layers 821 can be interrupted to form electrodes 829 limited to regions of the cantilevers with a single direction of curvature.

Figure 11:
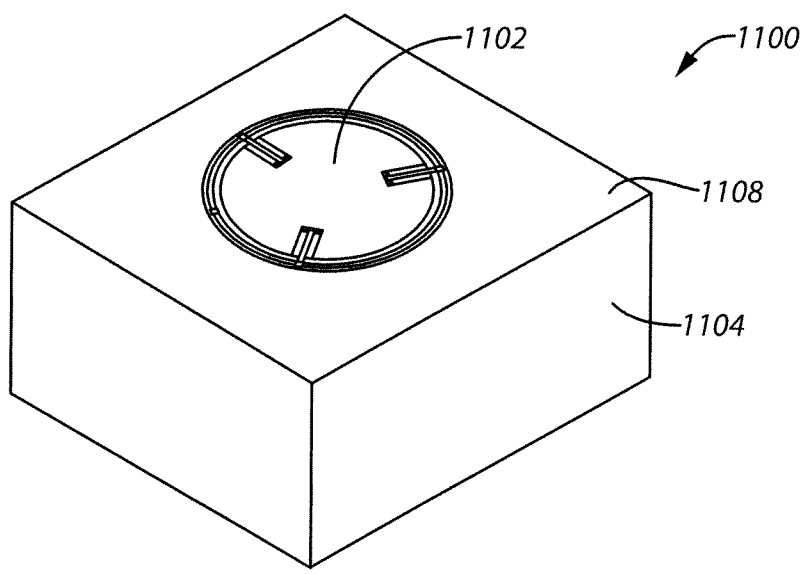
FIG. 11 comprises a perspective view of a sensing device according to various embodiments of the present invention.
Figures 12, 13:
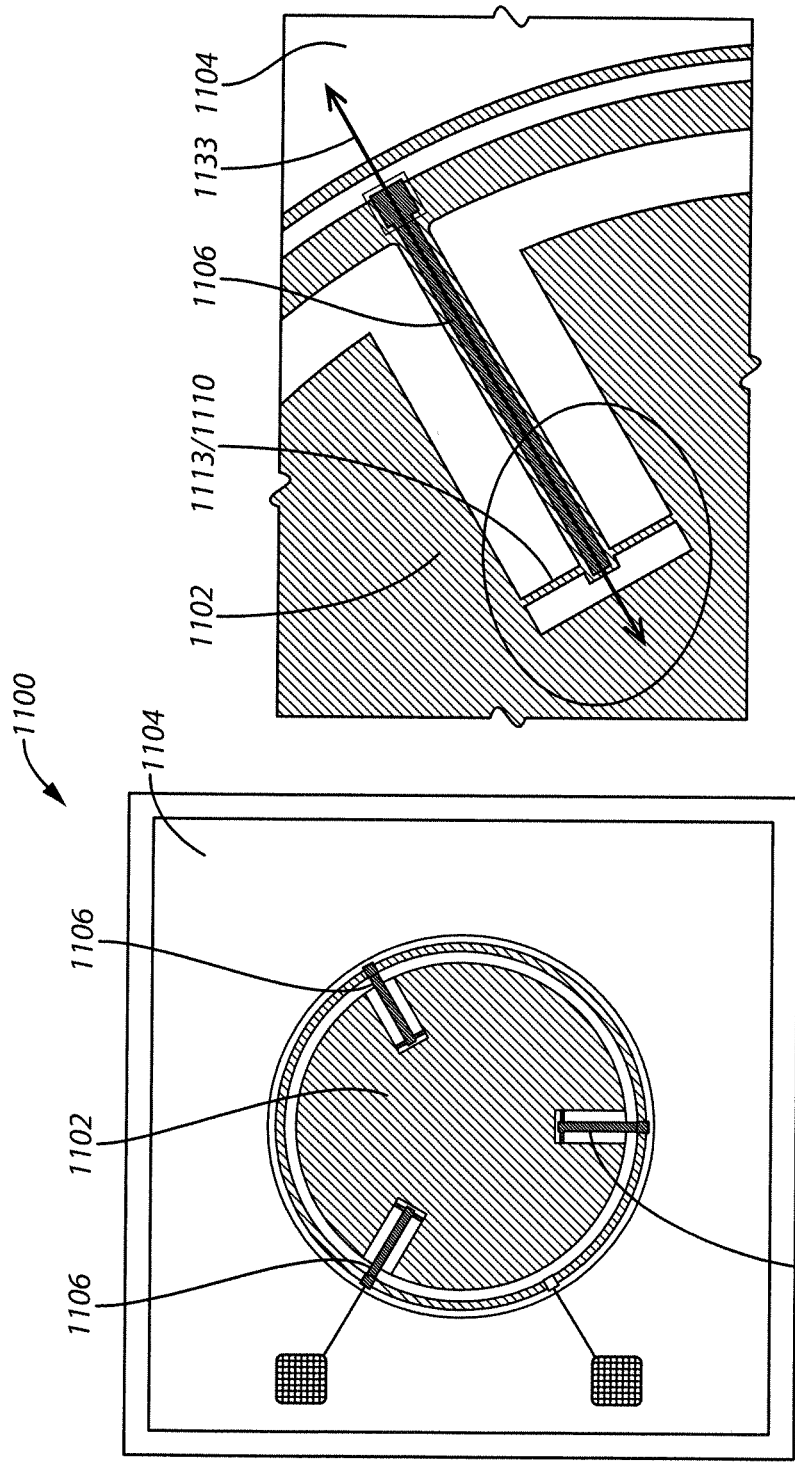
FIG. 12 comprises a top view of the sensing device of FIG. 11 according to various embodiments of the present invention.
FIG. 13 comprises a close-up of the top view of the examples of FIG. 11 and FIG. 12 according to various embodiments of the present invention.

Referring now to FIG. 11, FIG. 12, and FIG. 13 another example of a sensing apparatus 1100 and its connections is described. The sensing apparatus 1100 includes a diaphragm 1102, a support structure 1104, sensing elements 1106, a sealing material 1108, and a linking mechanism 1110. The linking mechanism 1110 may be the sealing material 1108 in one example. These elements are similar to similarly numbered elements described above with respect to FIGS. 2-6, and that description will not be repeated here.

One difference in the examples FIG. 11, FIG. 12 and FIG. 13 is that the seal portion/linking mechanism 1110 with connecting element 1113 may be filaments that connect the sensing element 1106 and the diaphragm 1102. The connection may be orthogonal (or tangential) to axis 1133 of the sensing element 1106 (and not along this axis as in the examples of FIGS. 2-6). The filaments may be separate or integrally formed with the diaphragm and/or cantilever.

Referring now to FIGS. 14-24, a process to manufacturing a sensing device or apparatus is described. It will be appreciated that this is one example of a manufacturing or fabrication process and that other examples are possible.

Figure 14:
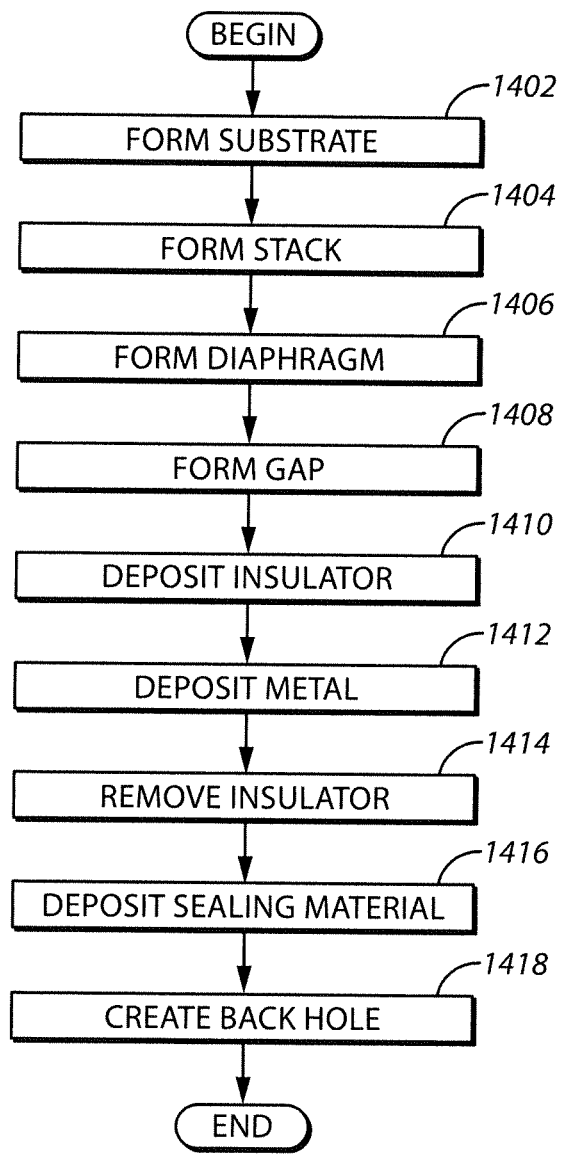
FIG. 14 comprises a flowchart of a process for fabricating a sensing device according to various embodiments of the present invention.
Figure 15:
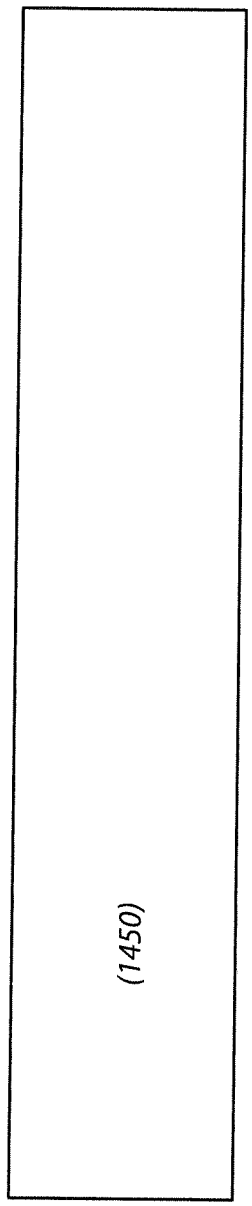
FIGS. 15-23 comprise diagrams showing implementation of the steps of the flowchart of FIG. 14 according to various embodiments of the present invention.

In this example, the steps shown in the flowchart of FIG. 14 correspond to the drawings of FIGS. 15-22. At step 1402, a substrate 1450 is formed (see FIG. 15). The substrate may be silicon.

Figure 16:
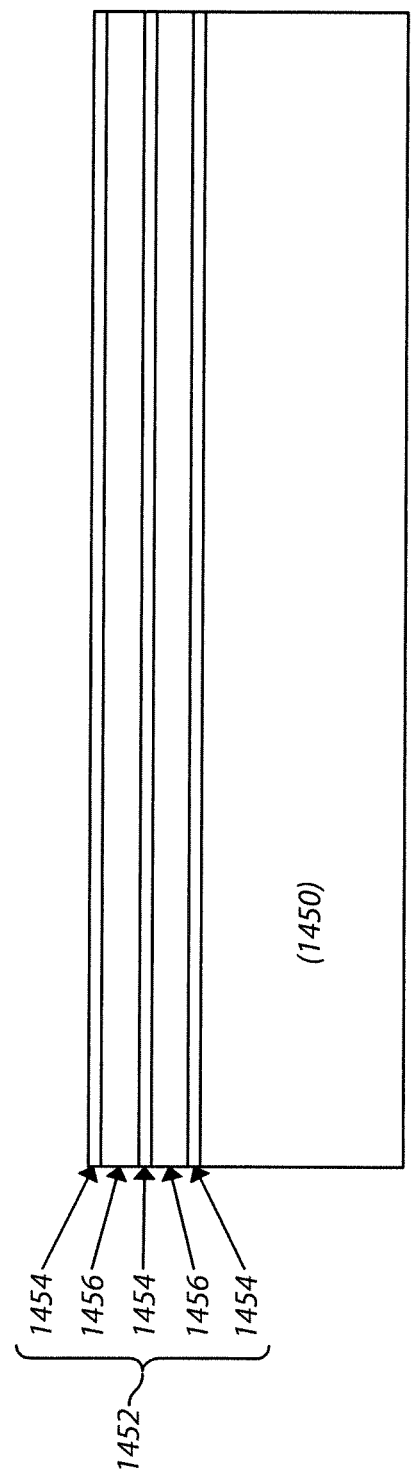

At step 1404, a piezoelectric stack 1452 is deposited on the substrate 1450 (see FIG. 16). The piezoelectric stack 1452 includes metal layers (Mo) 1454 and piezoelectric layers (AIN) 1456.

Figure 17:
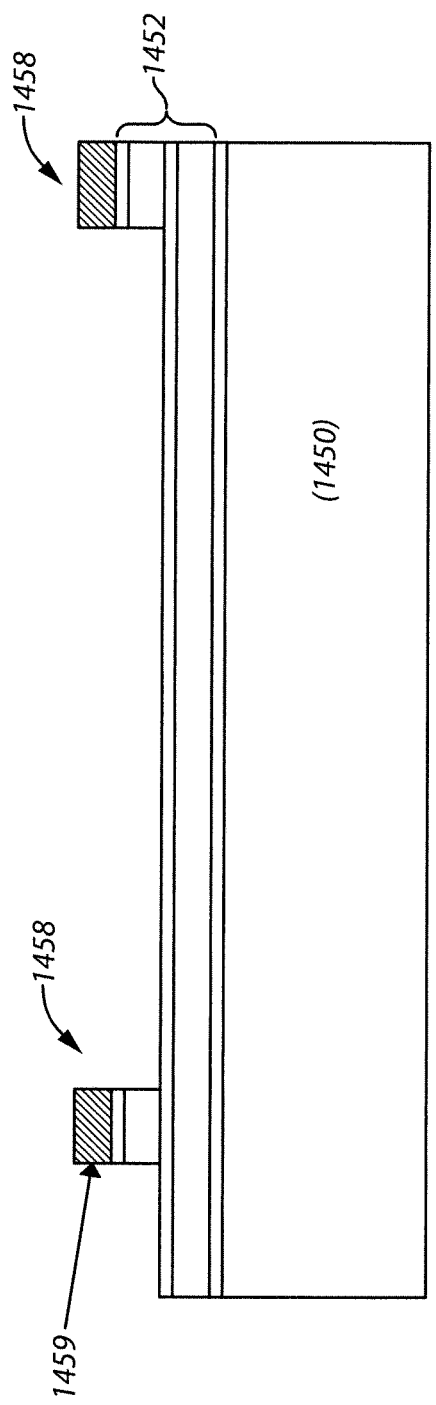

At step 1406, the sensing elements regions 1458 are formed (see FIG. 17). The center diaphragm region be reduced to minimize mass and thus maximize resonant frequency. A pattern with photo-resist 1459 is deposited, Mo (metal layers) are dry etched off, stopping at an AIN (piezoelectric) layer and resulting in the device shown in FIG. 17.

Figure 18:
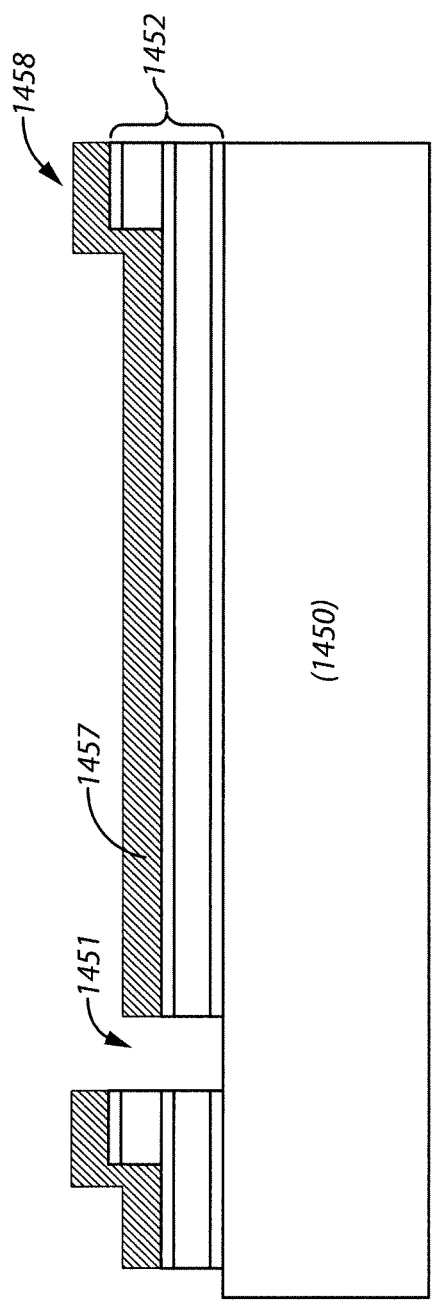
Figure 19:
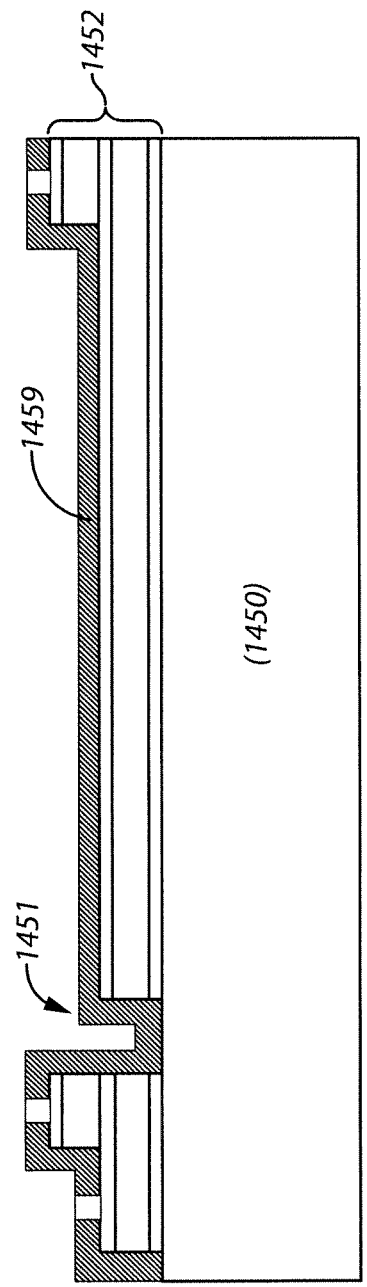
Figure 20:
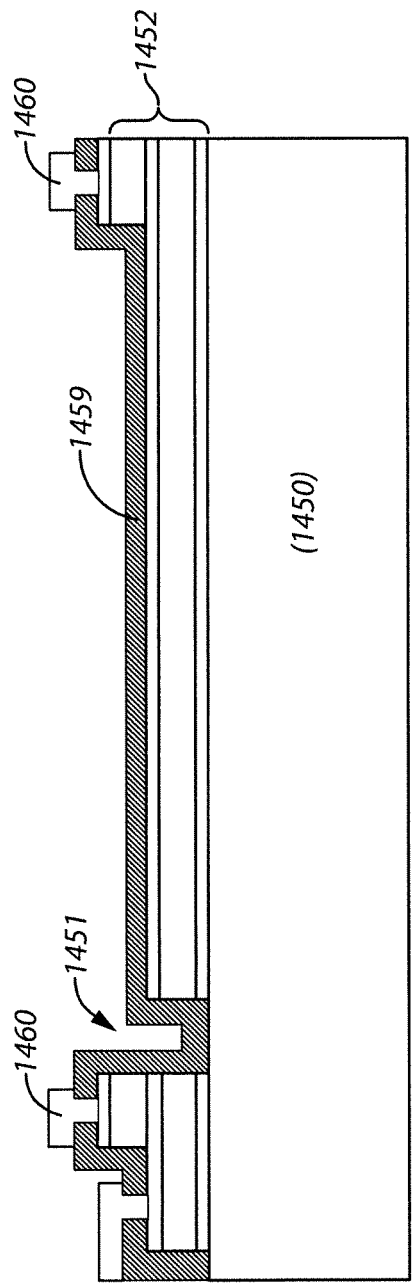
Figure 21:
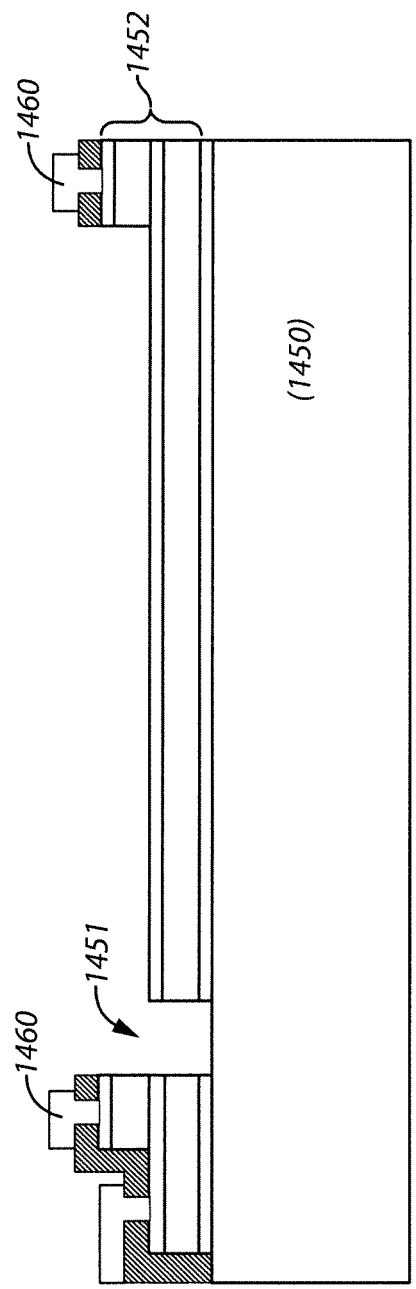

At step 1408, another pattern with photo-resist 1457 is applied, and an etching stops on the silicon substrate 1450 to form the gap 1451 (See FIG. 18). At step 1410, an insulator layer 1459 is deposited and contacts etched (see FIG. 19).

At step 1412, metal 1460 is deposited and patterned. (see FIG. 20) At step 1414, some of the insulator layer 1459 is removed by etching (see FIG. 21).

Figure 22:
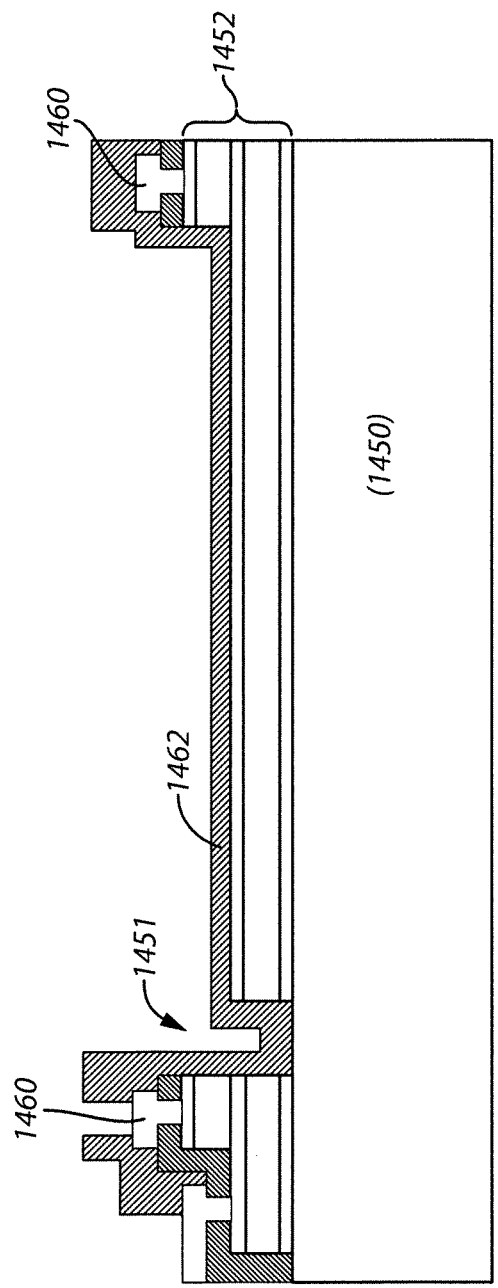
Figure 23:
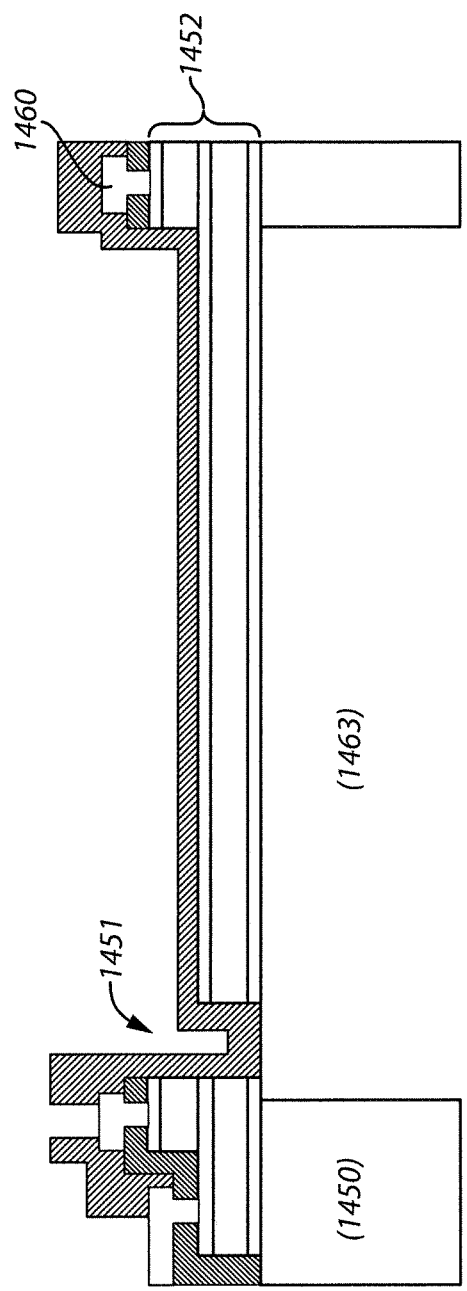

At step 1416, sealing layer 1462 is deposited and patterned (see FIG. 22). At step 1418, a back hole 1463 is created (see FIG. 23). Consequently, the sensing device fabrication process is complete.

Figure 24:
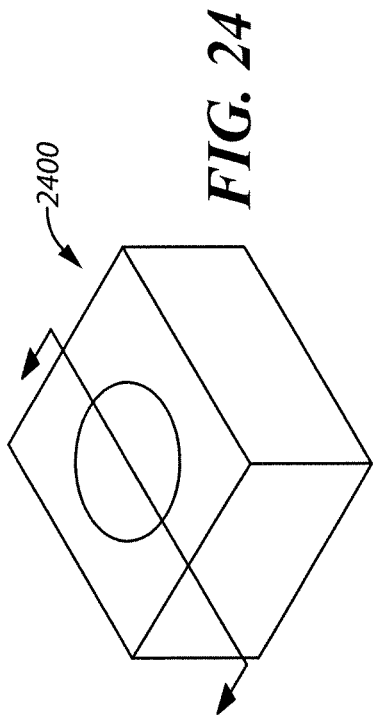
FIG. 24 comprises a perspective diagram of capacitive sensing device according to various embodiments of the present invention.
Figure 25:
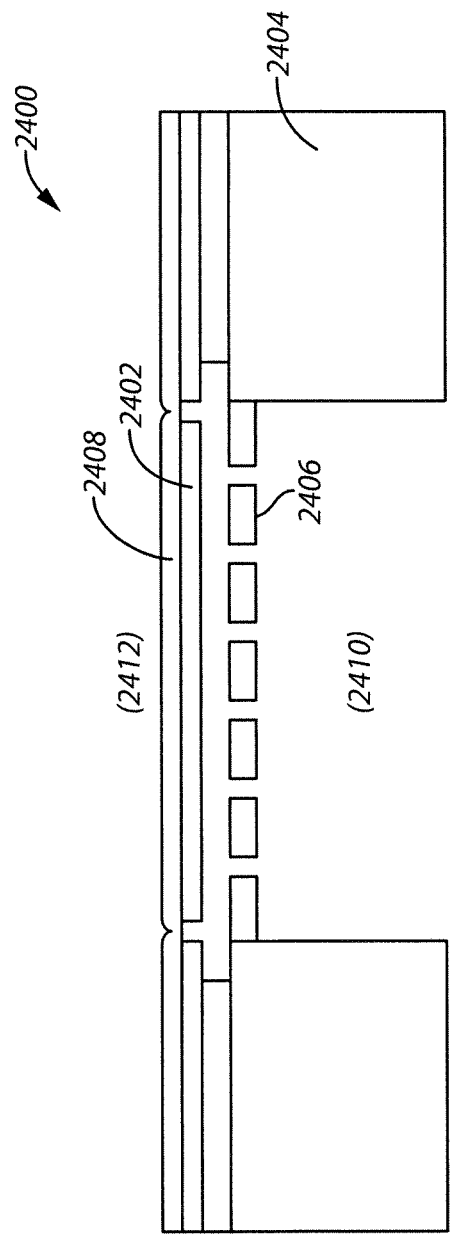
FIG. 25 comprises a side cutaway diagram of the sensing device of FIG. 24 according to various embodiments of the present invention.

Referring now to FIG. 24 and FIG. 25, one example of a capacitive sensor device 2400 is described. The sensing apparatus 2400 includes a diaphragm 2402, a support structure 2404, a back plate 2406, and sealing material 2408. In this instance, the diaphragm 2402 is a free plate diaphragm that is free to move within constraints (e.g., posts or boundaries) however other simply supported diaphragms are envisioned.

In operation, sound moves the diaphragm 2402 to create a changing electrical capacitance with the back plate 2406 to produce an electric signal.

The sealing material 2408 acoustically seals a front volume 2410 from a back volume 2412. However, a vent may pierce the diaphragm to provide for pressure equalization. The sealing material 2408 provides an acoustic seal and better tolerance at low frequency performance.

Figure 26:
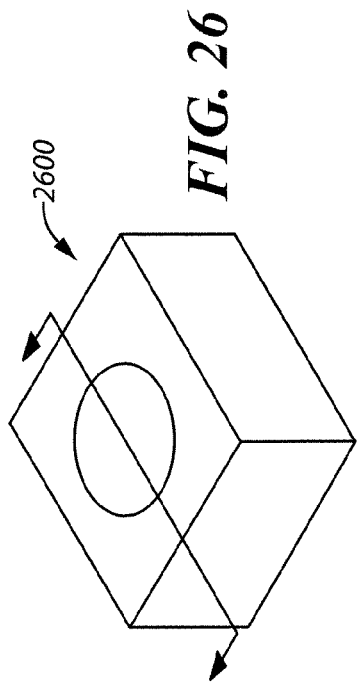
FIG. 26 comprises a perspective diagram of a photo sensing device according to various embodiments of the present invention.
Figure 27:
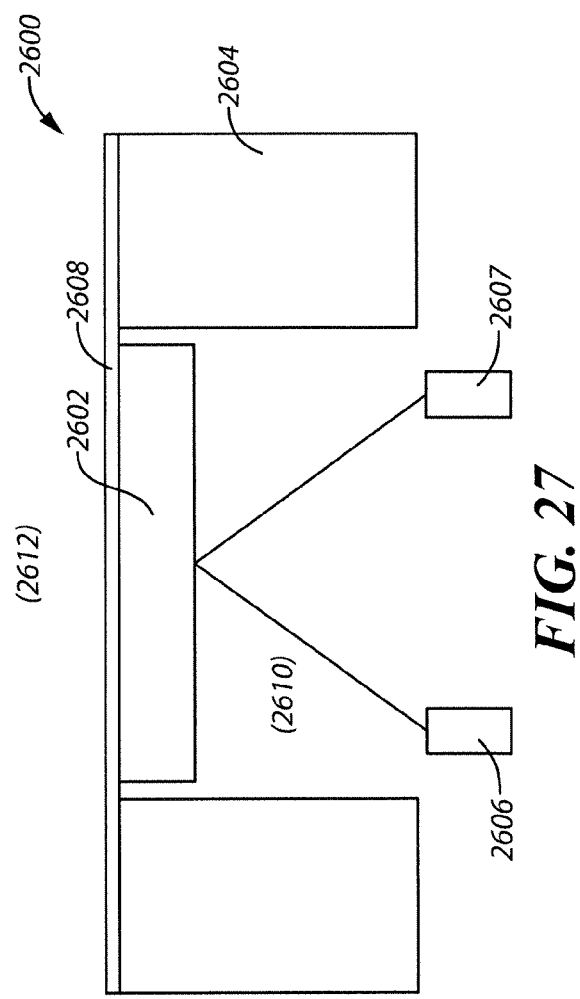
FIG. 27 comprises a side cutaway diagram of the sensing device of FIG. 26 according to various embodiments of the present invention.

Referring now to FIG. 26 and FIG. 27, one example of a photo sensing device 2600 is described. The sensing apparatus 2600 includes a diaphragm 2602, a support structure 2604, a light emitter 2606 and a light detector 2607, and sealing material 2608. The diaphragm 2602 is a simply supported diaphragm that is free to move within constraints (e.g., posts or boundaries).

In operation, sounds moves the diaphragm 2602. Light emitted by emitter 2606 is reflected by the diaphragm 2602 and sensed by the light detector 2607. The movement of the diaphragm 2602 can thus be sensed and tracked. The sensed changes in light pattern is representative of the acoustic energy received.

The sealing material 2608 acoustically seals a front volume 2610 from a back volume 2612. The sealing material 2608 provides an acoustic seal and enables a large displacement.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An acoustic sensing apparatus, comprising:
   a diaphragm;
   a support structure surrounding the diaphragm, wherein a gap is located between the support structure and the diaphragm, and wherein the diaphragm and the support structure separate a front volume and a back volume;
   one or more sensing elements located in the gap, wherein a first end of each of the one or more sensing elements is coupled to the support structure and is nonmoving with respect to the support structure, and wherein a second end of each of the one or more sensing elements is free to move with respect to the support structure;
   a sealing material extending between the diaphragm and the support structure, wherein the sealing material creates an acoustic seal between the front volume and the back volume; and
   a sensor that converts a diaphragm movement into an electrical signal,
   wherein the second end of each of the one or more sensing elements is coupled to the sealing material.

2. The acoustic sensing apparatus of claim 1, wherein the one or more sensing elements comprise at least one piezoelectric layer.

3. The acoustic sensing apparatus of claim 1, wherein the one or more sensing elements comprise at least one piezoresistive layer.

4. The acoustic sensing apparatus of claim 1, further comprising a fixed electrode parallel to and spaced from the diaphragm, wherein the sensor is a capacitive sensor.

5. The acoustic sensing apparatus of claim 1, further comprising a light detector arranged to detect the displacement of the diaphragm, wherein the sensor is an optical to electrical transducer.

6. The acoustic sensing apparatus of claim 1, wherein the one or more sensing elements bend in substantially a C-shape and not in a symmetric S-shape under acoustic pressure.

7. The acoustic sensing apparatus of claim 1, wherein the one or more sensing elements is defined substantially by a single direction of curvature under applied acoustic pressure.

8. The acoustic sensing apparatus of claim 1, wherein the sealing material is polydimethylsiloxane (PDMS).

9. The acoustic sensing apparatus of claim 1, wherein at least one of the diaphragm, the sealing material in the gap, and the support structure includes a vent.

10. A microphone, comprising:
    a base;
    an acoustic sensor fixed to the base comprising:
       a diaphragm;
       a support structure surrounding the diaphragm, wherein a gap is located between the support structure and the diaphragm, and wherein the diaphragm and the support structure separate a front volume and a back volume;
       one or more sensing elements located in the gap, wherein a first end of each of the one or more sensing elements is coupled to the support structure and is non-moving with respect to the support structure, and wherein a second end of each of the one or more sensing elements is free to move with respect to the support structure;
       a sealing material extending between the diaphragm and the support structure, wherein the sealing material creates an acoustic seal between the front volume and the back volume; and a sensor that converts a diaphragm movement into an electrical signal, wherein the second end of each of the one or more sensing elements is coupled to the sealing material; and a cover disposed on the base, wherein the cover encloses the acoustic sensor.

11. The microphone of claim 10, wherein a port extends through the base, and wherein the cover and the base define, at least in part, the back volume.

12. The microphone of claim 10, wherein the one or more sensing elements bend in substantially a C-shape and not in a symmetric S-shape under acoustic pressure.

13. The microphone of claim 10, wherein the one or more sensing elements are defined by a substantially single direction of curvature under applied acoustic pressure.

14. The microphone of claim 10, wherein the sealing material is polydimethylsiloxane (PDMS).

15. The microphone of claim 10, wherein at least one of the diaphragm, the sealing material in the gap, and the support structure includes a vent.

16. The microphone of claim 10, wherein the one or more sensing elements comprise at least one piezoelectric layer.

17. The microphone of claim 10, wherein the one or more sensing elements comprise at least one piezoresistive layer.

18. The microphone of claim 10, further comprising a fixed electrode parallel to and spaced from the diaphragm, wherein the acoustic sensor comprises a capacitive sensor.

19. The microphone of claim 10, further comprising a light detector arranged to detect displacement of the diaphragm, wherein the acoustic sensor comprises an optical to electrical transducer.

20. The microphone of claim 1, wherein each of the one or more sensing elements is a cantilever.

* * * * *